United States Patent [19]
Hibino et al.

[11] Patent Number: 5,776,827
[45] Date of Patent: *Jul. 7, 1998

[54] WIRING-FORMING METHOD

[75] Inventors: Satoshi Hibino; Tetsuya Kuwajima, both of Hamamatsu, Japan

[73] Assignee: Yamaha Corporation, Hamamatsu, Japan

[ * ] Notice: The term of this patent shall not extend beyond the expiration date of Pat. No. 5,529,955.

[21] Appl. No.: 643,044

[22] Filed: May 2, 1996

Related U.S. Application Data

[63] Continuation-in-part of Ser. No. 296,022, Aug. 25, 1994, Pat. No. 5,529,955.

[30] Foreign Application Priority Data

Aug. 27, 1993 [JP] Japan ................................. 5-213239
Jul. 15, 1994 [JP] Japan ................................. 6-164349

[51] Int. Cl.$^6$ ........................................ H01L 21/44
[52] U.S. Cl. ........................................ 438/627; 438/626
[58] Field of Search ........................ 437/195, 189, 437/192, 203, 187, 190, 200, 193; 438/627, 626, 672, 683

[56] References Cited

U.S. PATENT DOCUMENTS

| | | |
|---|---|---|
| 4,804,560 | 2/1989 | Shioya et al. . |
| 4,876,223 | 10/1989 | Yoda et al. . |
| 4,926,237 | 5/1990 | Sun et al. . |
| 4,960,732 | 10/1990 | Dixit et al. . |
| 5,106,781 | 4/1992 | Penning De Vries . |
| 5,231,055 | 7/1993 | Smith ........................ 437/192 |
| 5,260,232 | 11/1993 | Muroyama et al. ........ 437/195 |
| 5,286,675 | 2/1994 | Chen et al. ................. 437/195 |
| 5,288,665 | 2/1994 | Nulman . |
| 5,320,979 | 6/1994 | Hashimoto et al. . |
| 5,407,861 | 4/1995 | Marangon et al. . |
| 5,420,072 | 5/1995 | Fiordalice et al. . |
| 5,529,955 | 6/1996 | Habino et al. ............. 437/195 |

FOREIGN PATENT DOCUMENTS

| | | |
|---|---|---|
| 0199030 | 10/1986 | European Pat. Off. . |
| 6423554 | 1/1989 | Japan . |
| 1125847 | 5/1989 | Japan . |
| 417357 | 1/1992 | Japan . |

OTHER PUBLICATIONS

Novuyoshi Kobayashi, "Technique for Forming Fine Wiring, Using Tungsten CVD", 38th semiconductor specialized meetings preliminary text (Jul. 25–28, 1992).

Wolf, Stanley, Ph.D., "Silicon Processing For the VLSI ERA", Process Integration, vol. 2, Lattice Press, pp. 245–252, 1990.

Ono, Hisako, et al., "Development of a Planarized Al–Si Contact Filing Technology", VMIC Conference, Jun. 12–13, 1990, pp. 76–82.

Drynan, J.M., et al., "A Quarter–Micron Contact–Hole Definition Process Using Electron–Beam Lithography", Microelectronics Research Laboratories, NEC Corporation, pp. 38–39. Date unknown.

Primary Examiner—Kevin Picardat
Attorney, Agent, or Firm—Loeb & Loeb LLP

[57] ABSTRACT

An insulating layer 6 is formed covering a lower level wiring layer 5. Contact hole 11 registered with the lower level wiring 5 is then formed in the insulating layer 6. An adhesion layer 12 is sputtered on the lower level wiring layer 5 and a whole surface of the third level insulating layer 6. Then, a blanket tungsten layer 13 is deposited on the adhesion layer 12. The whole surface of the blanket tungsten layer 13 is etched back until a small hollow gap is formed at the upper end portion of the contact hole 11, to leave the blanket tungsten layer 13 only in the inside of the contact hole 11. Thereafter, an Al alloy layer is reflow-sputtered on the whole surface of the insulating layer 6 and the inside of the contact holes at a comparatively low temperature to form an upper level wiring layer 15. The surface unevenness produced in etch-back process can be planarized. A wiring having a good coverage, a good quality of layer, and a flat surface can be formed.

19 Claims, 13 Drawing Sheets

WIRING-FORMING METHOD

CROSS-REFERENCE TO RELATED APPLICATION

This application is a continuation-in-part application of U.S. patent application Ser. No. 08/296,022 filed on Aug. 25, 1994, now U.S. Pat. No. 5,529,955.

BACKGROUND OF THE INVENTION a) Field of the Invention

The present invention relates to a wiring-forming method used in a semiconductor integrated circuit or the like.

b) Description of the Related Art

In a process of manufacturing a semiconductor integrated circuit, wirings for connecting respective elements are formed after the respective elements are formed. The process of forming wirings, generally, is achieved by a procedure such as the following. First, contact holes are formed to expose electrode portions of respective elements (such as diffusion layers, polycrystalline silicon regions or the like) through an insulating layer which covers the whole surface of the substrate. Then, after depositing a metal layer as of aluminum (Al) over the whole surface of the insulating layer, selective etching of the metal layer using a mask of photo-resist is carried out to form wirings connecting the electrodes of the respective elements. Further, an inter-layer insulating film is formed, and an upper level wiring for connecting the wirings is formed by a similar procedure. Here, to obtain a normally operable semiconductor integrated circuit, it is necessary to obtain a complete electrical contact between the substrate, or a lower level wiring which has an exposed portion to be contacted via a contact hole, and the wiring. The following methods have been employed heretofore to satisfy this requirement.

(1) Blanket Tungsten Chemical Vapor Deposition

First, one or a plurality of adhesion layers selected from a group of Ti, TiN, TiW, and WSi is formed on a conductive portion to be contacted and on an insulating layer. Then, a tungsten film is laminated on a whole surface of the adhesion layer by chemical vapor deposition (CVD). Next, the whole surface of tungsten film is etched until the tungsten film becomes flush with the one or the plurality of adhesion layers so that the tungsten film remains only of inside of the contact holes. Thereafter, a wiring layer as of Al is deposited by sputtering on the whole surface. Etching is performed to produce wirings.

(2) Selective Tungsten Chemical Vapor Deposition

A tungsten layer is selectively grown only on the conductive portions exposed inside of the contact holes by CVD. Here, deposition of tungsten layers of the same thickness can only be obtained at respective contact holes even when there exists a plurality of contact holes with different depths. Thereafter, a wiring layer is deposited thereon and selectively etched to form wirings using the same method as described with reference to method (1).

(3) Reflow-Type Sputtering

A wiring layer is deposited over the whole surface of a substrate by sputtering under the condition that the substrate is heated to a high temperature. According to this method, the sputtered wiring layer is fluidized to flow into contact holes.

However, in the prior art wiring forming methods as described above, there were problems such as following.

First, according to method (1), as shown in FIG. 3A, it has been the case that unnecessary tungsten 13a could remain at a step-like portion of adhesion layer 12 even though etching was performed to the extent that a tungsten layer 13 within a contact hole 11 reached the same level as the adhesion layer 12. An excessive etching or an over-etching exceeding the optimum level has to be performed to remove the unnecessary tungsten 13a. Thus, as shown in FIG. 3B, the surface of the tungsten layer 13 has recessed to a depth of about $D_1=0.3$ to 0.5 μm from an upper end portion of the contact hole 11. When a wiring layer 14 as of Al alloy was then formed by the usual sputtering, the wiring layer 14 is also recessed approximately the same amount as the depth $D_1$ of the surface of the tungsten layer 13 within the contact hole 11, as shown in FIG. 3C.

Next, according to method (2), as shown in FIG. 4, when contact holes 11a and 11b each having a different depth were formed, a tungsten layer 13 having a thickness corresponding to the shallower contact hole 11b fills the holes. Accordingly, a gap with a depth from an upper end portion of the hole 11a to the surface of the tungsten layer 13 of about $D_2=0.3$ to 0.5 μm results in the contact hole 11a which is deeper than the contact hole 11b. Thus, when a wiring layer 14 is deposited, a surface of the wiring layer 14 is recessed at a part corresponding to the contact hole 11a.

As described above, according to method (1) and method (2), there has been a problem that a sufficient coverage or degree of coverage cannot be obtained when the wiring layer 14 is deposited.

Next, according to method (3), as shown in FIG. 5, when an aspect ratio V/H, defined by a ratio of a vertical dimension (height) V of a contact hole 11 in a direction perpendicular to a bottom surface, to a horizontal dimension (diameter) H of the contact hole 11 in a direction parallel to the bottom surface is large (which means that it is equal to or larger than 1), it is the case that a void VD is formed and remains in a wiring layer 14 within the contact hole 11. Thus, there was a problem that a breakage occurs when electricity flows electricity. Method 3 also had the problem that, because sputtering is performed in a high temperature, the quality of the layers is deteriorated and durability against, electro-migration is lowered, and hence breakage and short-circuiting can occur.

SUMMARY OF THE INVENTION

An object of the present invention is to provide a wiring-forming method for forming a wiring layer having good coverage, good quality, and a flat surface.

According to one aspect of the present invention, a wiring-forming method comprises the steps of forming an insulating layer covering an underlying layer which includes a contact portion exposed to an upper surface, forming a contact hole in the insulating layer at a position registered with the contact portion, sputtering at least one adhesion layer on the surface of the contact portion exposed in the contact hole and the insulating layer, depositing a blanket tungsten layer on the adhesion layer by CVD, etching the whole surface of the blanket tungsten layer until a small gap is formed at an upper end portion of the contact hole, to leave a tungsten film only in the inside of the contact hole, and forming a wiring layer on the whole surface of the insulating layer and the inside of the contact hole filled with the tungsten film by performing a reflow-type sputtering.

The reflow sputtering mentioned above is preferably performed at a temperature range from 350° C. to 500° C.

The portion to be contacted, in this specification, is an impurity diffusion region or a wiring, and is also a portion to be connected electrically with an upper level wiring.

Because a sufficient etching is to be performed to leave a tungsten layer only in the inside of the contact hole, the inside of the contact hole is over-etched producing an unfilled portion in the contact hole. A wiring layer, however, fills the inside of the contact hole, and a surface of the wiring layer formed thereon becomes flat because the wiring layer is formed by a reflow-type sputtering. Further, since the tungsten layer is etched up to a level so that only a small gap is left at an upper end portion of the contact hole and the contact hole becomes shallow, the aspect ratio becomes small, and, consequently, a reflow-type sputtering can be performed at a comparatively low temperature. Thus, a deterioration of the quality of the layer can be prevented. Here, an adhesion layer selected from the group of Ti, TiN, TiW, W, MoSi, TiON and WSi prevents the peeling-off of the tungsten layer.

By etching to leave the tungsten layer only at the inside of the contact hole, the inside of the contact hole is over-etched. However, by forming a wiring layer by reflow-sputtering a conductive wiring material at a comparatively low temperature on the whole surface of the insulating layer and on the inside of the contact hole provided with the tungsten layer, the wiring layer is embedded fully on the inside of the contact hole and the surface of the wiring layer becomes flat.

DESCRIPTION OF THE PREFERRED EMBODIMENTS

Figure 6A:
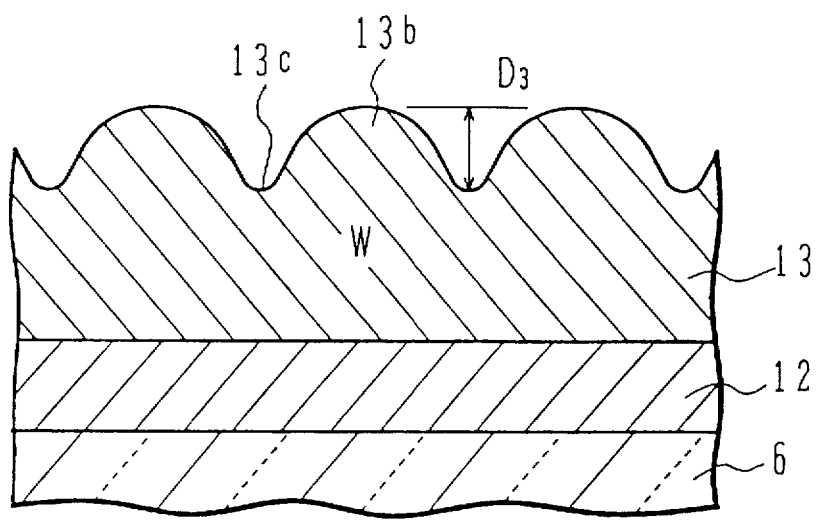
FIGS. 6A to 6C are sectional views of a semiconductor device illustrating results of analyses of wiring-forming experiments on a blanket tungsten CVD method performed by the inventor.

The present inventor has achieved various experiments and discussions and has found that there is a novel problem in the aforementioned method (1). A tungsten layer 13 formed by CVD using the hydrogen reduction of $WF_6$ on an adhesion layer 12, as shown in FIG. 6A, includes large grown crystal grains and forms an unevenness on the surface of the tungsten layer 13 which results in surface asperity. For example, a difference of height D3 between the top of a convex part 13b and the bottom of a concave part 13c of the tungsten layer 13 is approximately 300 nm.

Figure 6B:
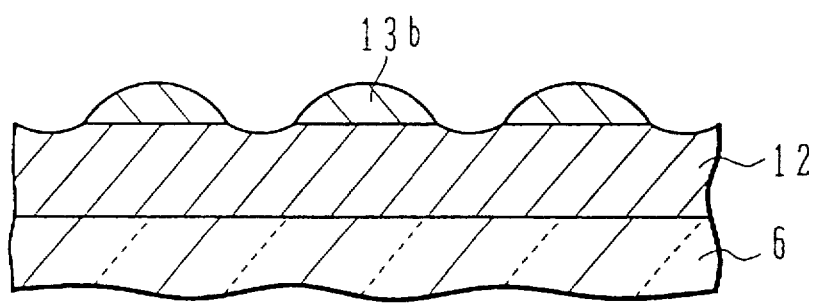
Figure 6C:
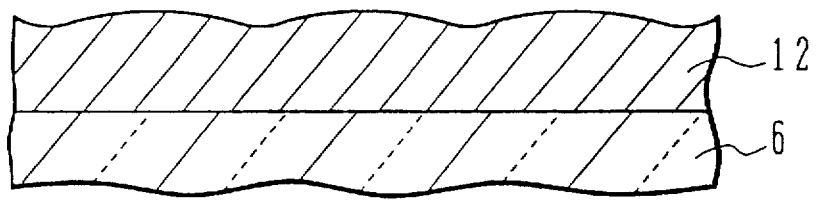

For leaving tungsten only at contact holes, the tungsten layer 13 is etched back. As shown in FIG. 6B, tungsten at the concave part 13c is etched off firstly to expose the adhesion layer 12. At this stage, tungsten at the convex part 13b still remains. It is thus necessary to further continue etching. By further continuing etching, an exposed part of the adhesion layer 12 is also etched even if the etching rate is low. When over-etching is finished, as shown in FIG. 6C, the surface of the adhesion layer 12 is provided with an unevenness resulting from depressions generated through the overetching. Such unevenness is smaller than that of the surface of the tungsten layer 13 before etching. For example, when the difference of height $D_3$, between the top of a convex part 13b and the bottom of a concave part 13c of the tungsten layer is approximately 300 nm, a difference of height between the top of a convex part and the bottom of a concave part of the adhesion layer 12 is approximately 30 nm. When a wiring layer, as of Al alloy, is formed on the surface of the uneven adhesion layer 12, by usual sputtering, the wiring layer will have the same unevenness as is provided on the surface of the adhesion layer 12. At the time of exposure of a photoresist in the step of patterning a wiring, such unevenness formed on the surface of the wiring layer will result in an irregular reflection of the exposing light on the surface of the wiring layer, and will disable formation of desired mask, meaning that it is difficult to form a desired wiring pattern.

The present invention will be described specifically hereinunder. The spirit and scope of the present invention is not limited to embodiments which are to be disclosed below.

FIGS. 1A to 1J show a series of steps of wiring-forming method according to a first embodiment of the present invention.

Figure 1A:
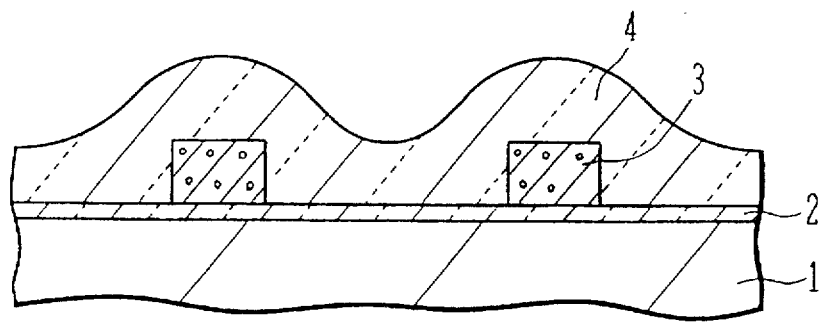
FIGS. 1A to 1K are longitudinal sectional views of a semiconductor device for illustrating steps of a wiring-forming method according to a first embodiment of the present invention.

In the first embodiment, a first level insulating layer 2 formed of an insulating film as of $SiO_2$ is formed on a semiconductor substrate or wafer 1, as shown in FIG. 1A. A polycrystalline Si wiring 3 is formed on the first level insulating layer 2. Further, on the polycrystalline Si wiring 3 and the first level insulating layer 2, a second level insulating layer 4 of an insulating material as of $SiO_2$ is formed. The second level insulating layer 4 has an undulated surface.

Figure 1B:
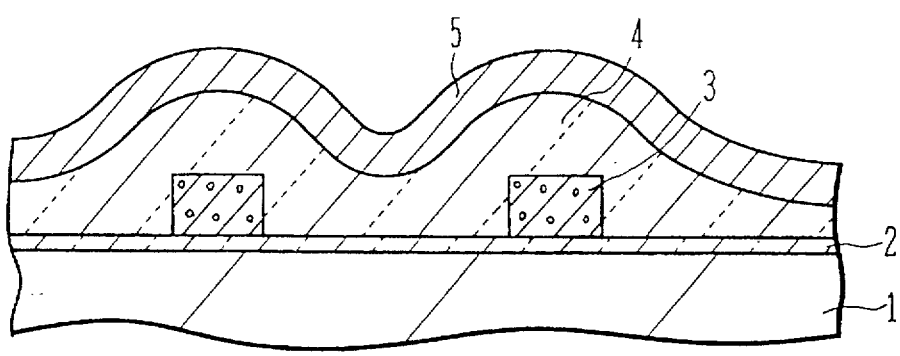

Next, as shown in FIG. 1B, a lower level wiring 5 is formed by depositing an Al alloy layer as of AlSiCu on the second level insulating layer 4, and selectively etching the same using photo-lithography. In the present specification, the term "Al alloy" is used to include pure aluminum, an alloy of aluminum and silicon, and an alloy of aluminum, silicon and copper.

Figure 1C:
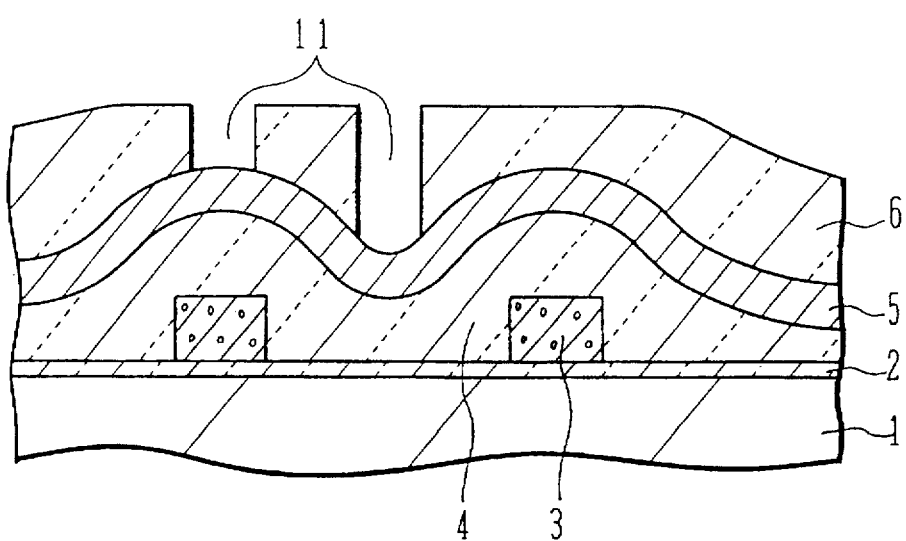

Thereafter, as shown in FIG. 1C, a third level insulating layer 6 formed of an insulating material as of $SiO_2$ is formed on the second level insulating layer 4 and on the lower level wiring 5. Through the third level insulating layer 6, contact holes 11 are formed by etching. The Al alloy layer 5 also has an undulated surface. When plural contact holes above a convex portion of the Al alloy layer 5 and a concave portion of the Al alloy layer 5 are to be formed through the third level insulating layer 6, the depths of the contact holes differ because of the undulation.

Figure 1D:
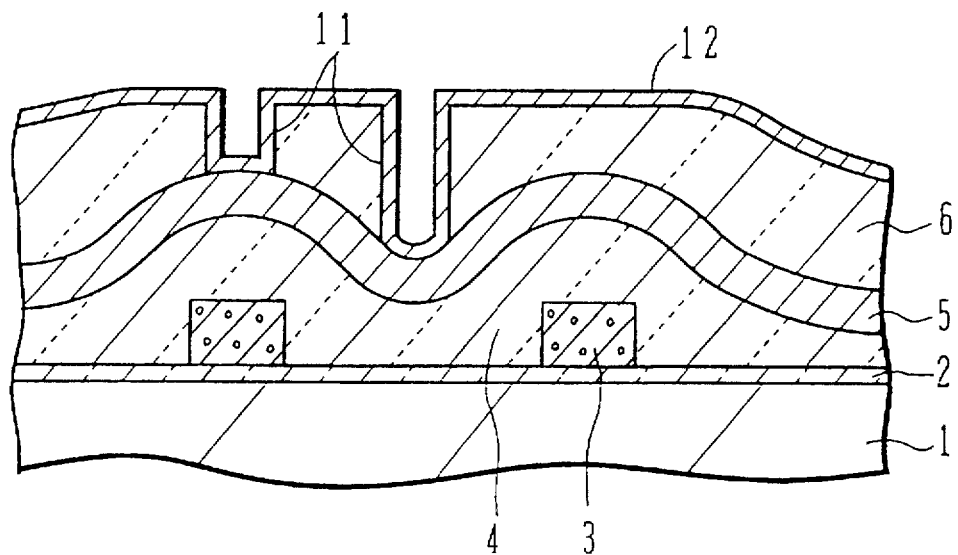

Further, as shown in FIG. 1D, on a surface of the contact holes 11 and a whole surface of the third level insulating layer 6, an adhesion layer 12 formed of one or more materials selected from a group of Ti, TiN, TiW, TiON and WSi is formed by using sputtering or a CVD method. The adhesion layer 12 firmly adheres to a tungsten layer to be successively formed thereon. To accomplish this purpose, the adhesion layer 12 may be formed by laminating plural layers, each comprising a material selected from a group of Ti, TiN, TiW, TiON and WSi (for example, laminating a Ti layer and a TiN layer). When the adhesion layer 12 of Ti is formed by sputtering, the sputtering conditions, for example, are as follows. The substrate heated to approximately 200° C. is located in an argon gas atmosphere at a pressure of 4 mTorr, and a flow rate of 20 sccm, approximately. Raw material of an adhesion layer 12 is deposited on the substrate 1 with a growth rate of approximately 100 nm/min until the layer has a thickness of approximately 20 nm. When the adhesion layer 12 of TiN is formed by sputtering, the sputtering conditions, for example, are as follows. The substrate heated to approximately 200° C. is placed in an Ar/$N_2$ mixture gas atmosphere at a pressure of 4 mTorr, and an approximate flow rate of 8/20 sccm, respectively. Raw material of an adhesion layer 12 is deposited on the substrate 1 with a growth rate of approximately 100 nm/min until the layer has a thickness of approximately 100 nm. When the adhesion layer 12 of WSi is formed by sputtering, the sputtering conditions, for example,are as follows. The substrate heated to approximately 200° C. is located in an argon gas atmosphere at a pressure of 8 mTorr, and a flow rate of 20 sccm, approximately. Raw material of an adhesion layer 12 is deposited on the substrate 1 with a growth rate of approximately 200 nm/min until the layer has a thickness of approximately 50 nm.

The adhesion layer 12 may also be formed of other materials such as tungsten (W), and molybdenum silicide (MoSi). These adhesion layers may be formed by sputtering using a target formed of W or MoSi. An example of sputtering conditions is: the sputtering gas being Ar, the pressure of the sputtering gas being 4 mTorr, DC power of sputtering being 5 kW, substrate temperature being about 200° C. and thickness of a sputtered film being about 100 nm.

Figure 1E:
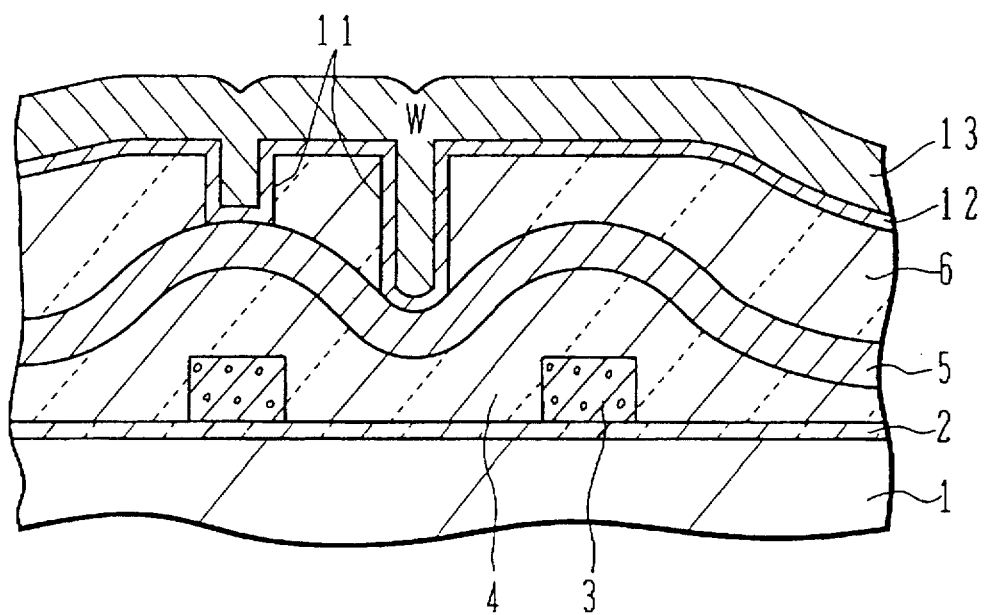

Next, as shown in FIG. 1E, a blanket tungsten layer 13 is formed on the adhesion layer 12 by a method such as CVD. The contact holes 11 are filled with the blanket tungsten layer 13. The CVD conditions for forming the tungsten layer by a CVD method, for example, are as follows. The substrate heated to approximately 450° C. is located in a $WF_6$ gas atmosphere at a pressure of 50 Torr, and a flow rate of 80 sccm, approximately. Raw material of the blanket tungsten layer 13 is deposited on the substrate 1 with a growth rate of approximately 300 to 500 nm/min until the tungsten layer 13 has a thickness of approximately 600 nm.

Conditions for forming a blanket tungsten layer by CVD may be: source gas being a mixture of $WF_6+_2+Ar+N_2$, flow rates being 50–100 sccm for $WF_6$, 500–2000 sccm for $H_2$, 1000–2000 sccm for Ar, and 100–300 sccm for $N_2$, respectively, pressure of the source gas being 50–100 Torr, and substrate temperature being 400°–500° C.

Figure 1F:
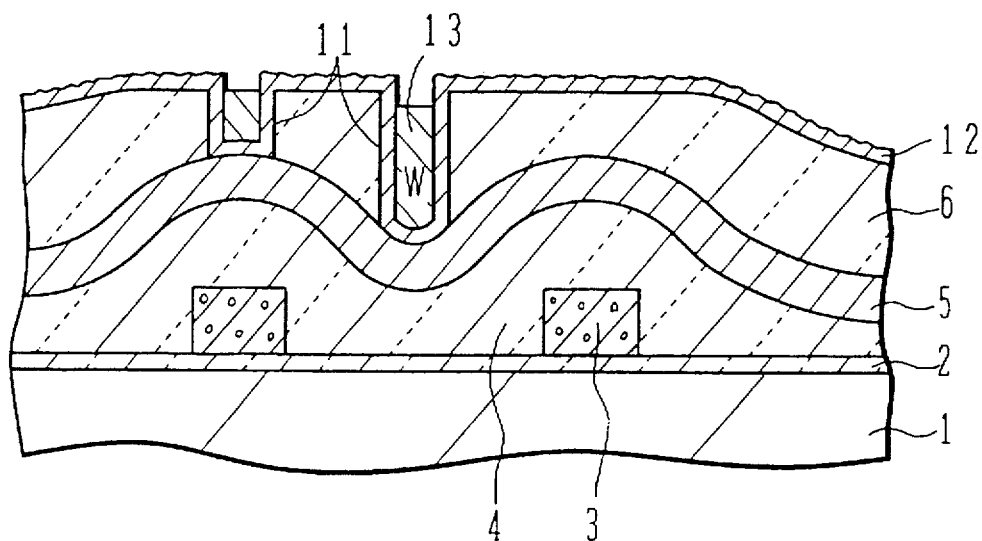

Next, the tungsten layer 13 is dry-etched with an etching gas, e.g. $SF_6$, which has an etching selectivity ratio of the adhesion layer 12 and the tungsten layer 13 at 1:10 to 30, to leave the tungsten layer 13 only in the inside of the contact holes 11. In this step, when etching is insufficient, unnecessary tungsten is left at cavities other than contact holes on the surface of the adhesion layer 12. For example, when there is a step on the third level insulating layer 6, the adhesion layer 12 formed thereon will have a step. Thus unnecessary tungsten will be left at a lower part of the step of the adhesion layer 12. Therefore, an etching to be performed here, as shown in FIG. 1F, should be an overetching on the whole surface of the tungsten layer except the contact holes. Thus, a gap is formed at the upper end portion of the contact holes 11 so that the surface of the tungsten layer 13 is positioned a little depth lower from the top end portion of the contact holes 11. At the maximum, the gap will be half the depth of the contact hole. As a result, the contact holes 11 are partially filled with tungsten.

Figure 1G:
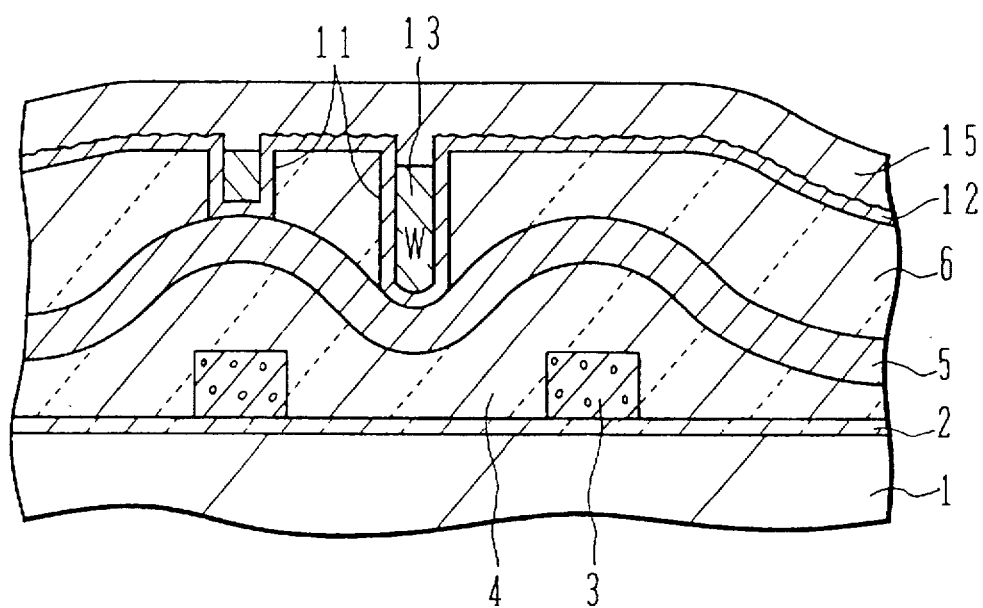

Thereafter, as shown in FIG. 1G, an upper level wiring layer 15, formed of an Al alloy film, and the like is formed on a whole surface of the insulating layer 6 and the inside of the contact hole 11 filled with the tungsten layer 13, by reflow-sputtering a conductive wiring material such as AlSiCu (with 1 wt % of Si, 0.5 wt % of Cu, and remainder of Al) or the like at 500° C. or a lower temperature.

The reflow-type sputtering mentioned above is such a method wherein, while heating a substrate on which an upper level wiring layer 15 is to be formed, a conductive wiring material is deposited on the substrate by sputtering, and the deposited conductive wiring material, is caused to flow thereby obtaining a flat surface of the deposited layer. Alternatively, after depositing a layer formed of a conductive wiring material on a substrate 1 by sputtering,the substrate 1 is heated to flatten the surface of the deposited layer.

When a reflow-type sputtering is performed over 500° C. durability against migration is reduced, and grain size of conductive wiring material becomes too large. This results in a deterioration of surface shape of the upper wiring layer 15. And, moreover, when AlSiCu is employed as a conductive wiring material, silicon and copper may be crystallized because of the high temperature and will be left as residua when removing unnecessary portions in the step of patterning the upper level wiring. The residua may short-circuit the wirings.

Further, reflow sputtering is preferably performed at a temperature range of 400° to 500° C., and more preferably at a temperature range of 400° to 450° C. In these temperature ranges, the unevenness of a surface of the adhesion layer 12 can be compensated while keeping a flatness of the upper level wiring layer 15. This is because reflowed conductive material of the upper level wiring layer 15 fills depressions generated through the overetching process and further the conductive material is fluidized through the reflow-sputtering process so that the surface of the conductive material is smoothed.

When the temperature of the reflow-type sputtering is lower than 400° C., fluidization of the conductive material of the upper level wiring layer 15 is insufficient, thus, flatness of the upper level wiring layer 15 deteriorates.

The conditions of forming an upper level wiring layer 15 by a reflow-type sputtering method, for example, are as follows. The substrate 1 heated to approximately 150° C. is placed in an argon gas atmosphere at a pressure of 2 mTorr, and a flow rate of 20 sccm, approximately. AlSiCu is deposited on the substrate 1 with a growth rate of approximately 1 μm/min until the deposited layer has a thickness of approximately 500 nm, and the substrate 1 provided with AlSiCu wiring is heated at 450° C. for 120 sec.

Figure 1H:
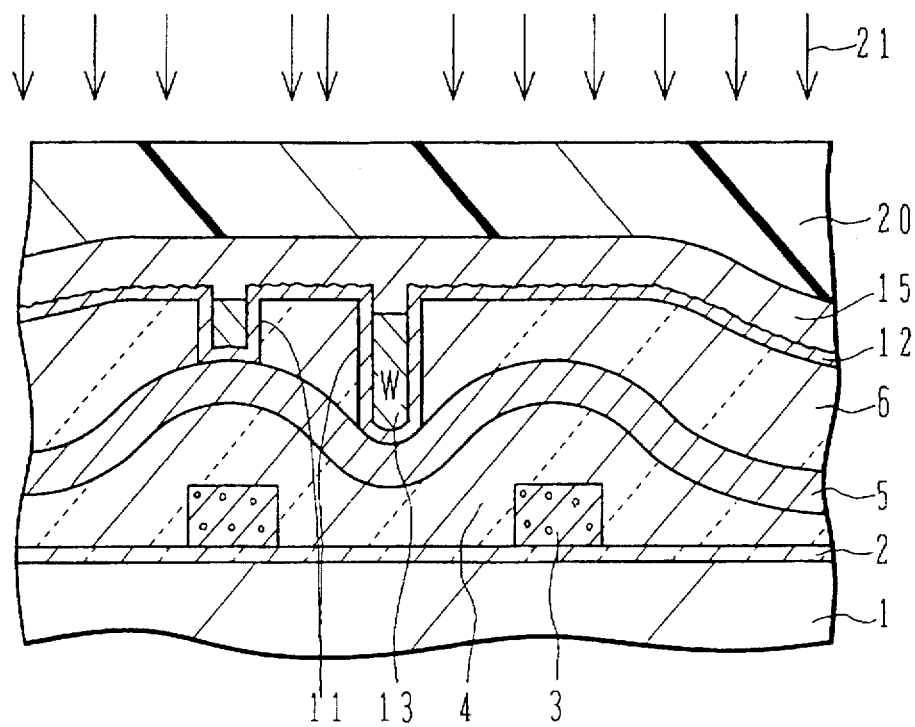

As shown in FIG. 1H, a photo-resist film 20 is spin-coated on the upper level wiring layer 15, which photo-resist film 20 is selectively irradiated by an ultraviolet ray 21 through a mask to expose patterns selectively. Since the upper level wiring layer 15 is provided with a flat surface, a desired wiring pattern can be transferred with good fidelity.

Figure 1I:
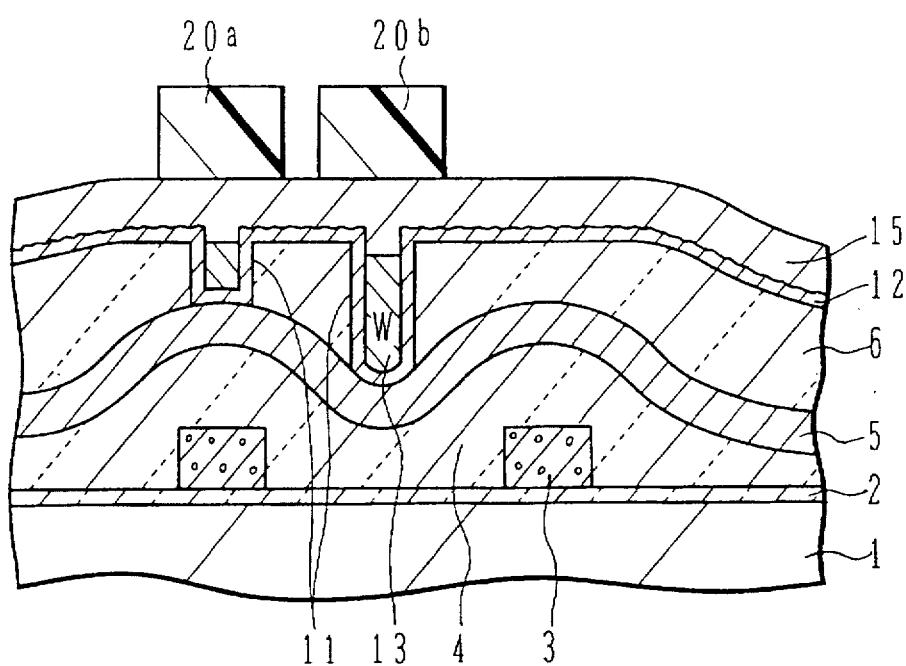

As shown in FIG. 1I, by developing the photo-resist film 20, unnecessary parts of the photo-resist film are removed to form resist patterns 20a and 20b.

Figure 1J:
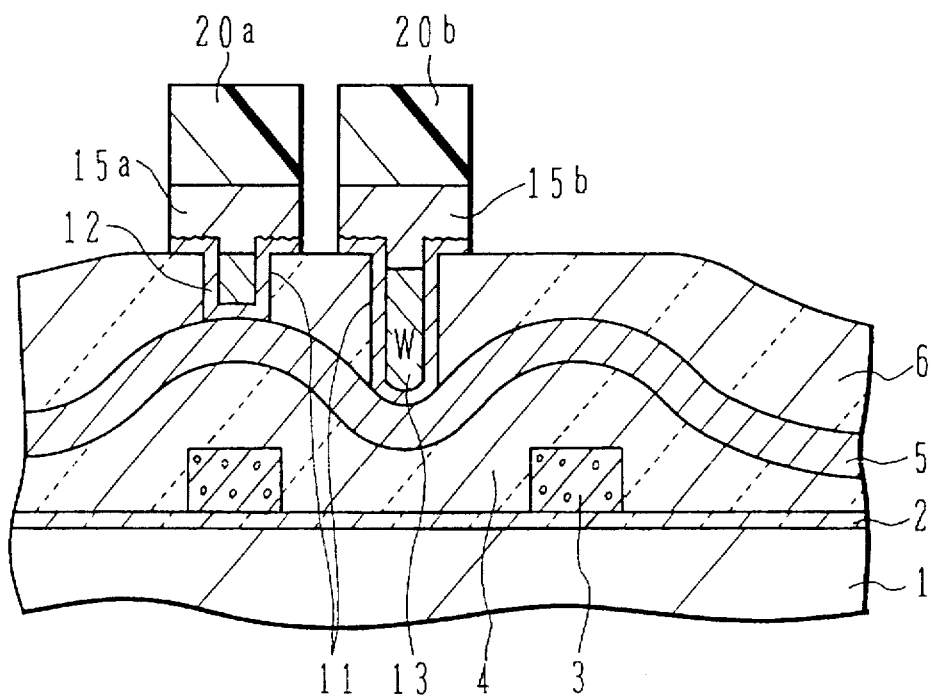

As shown in FIG. 1J, etching is performed utilizing the resist patterns 20a and 20b as masks to remove unnecessary portions of the upper level wiring layer 15. Thus upper level wiring patterns 15a and 15b are formed. The resist patterns 20a and 20b are thereafter removed by a method such as ashing.

Figure 1K:
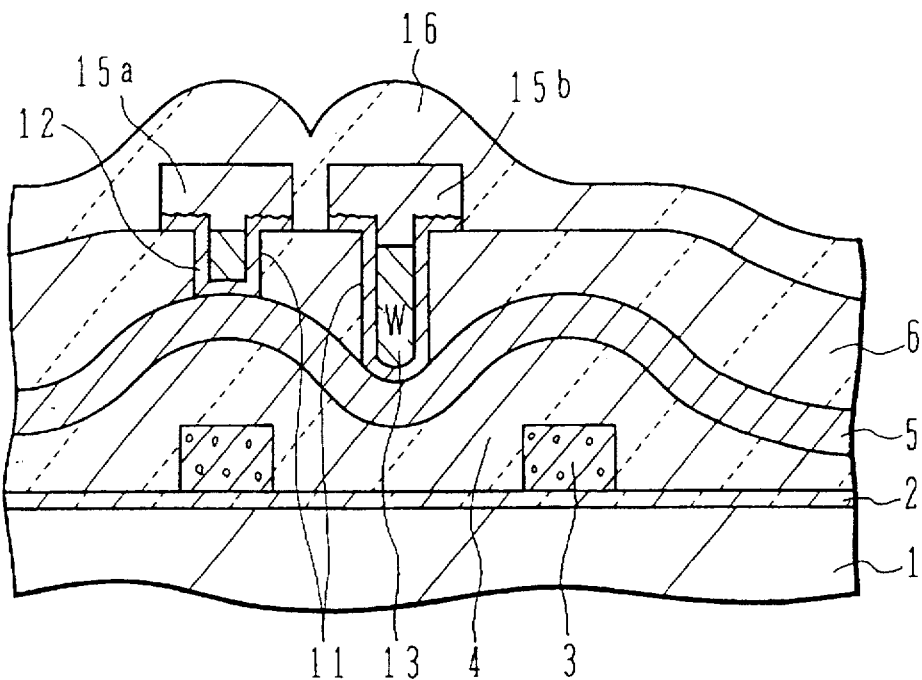

And, as shown in FIG. 1K, on the upper level wiring patterns 15a and 15b and on the whole surface of the third level insulating layer 6, a protecting layer 16 formed of SiN or the like is formed.

In the wiring forming method according to the first embodiment, a third level insulating layer 6 is formed covering a lower level wiring layer 5 and contact holes 11 exposing the lower level wiring 5 are formed in the third level insulating layer 6. And an adhesion layer 12 is formed on the exposed surface of the lower level wiring layer 5 and the surface of the third level insulating layer 6. Further, after forming a tungsten layer 13 on the adhesion layer 12, the whole surface of the tungsten layer 13 is etched back until a small gap is formed at the upper end portions of the contact holes 11 to leave the tungsten layer 13 only at the inside of the contact holes 11. The inside of each of the contact holes 11 is over-etched at this stage. Thereafter, an Al alloy layer is reflow-sputtered on the surface of the remaining adhesion layer 12 on the third level insulating layer 6 and the inside of the contact hole 11 at 500° C. or a lower temperature to form an upper level wiring layer 15. Thereby, the inside of the contact holes are filled with the upper level wiring layer 15 and the surface of the upper level wiring layer becomes flat. The aspect ratio before reflow-sputtering is also reduced, because the tungsten layer 13 is etched to such a degree that a small step is formed at the upper end of each of the contact holes 11 and hence the contact holes 11 become shallow. The reflow-type sputtering can be performed at a comparatively low temperature. Thus, a deterioration of the quality of the layer can be prevented.

The formation of the upper level wiring layer by reflow-type sputtering of conductive material at 500° C. or a lower temperature enables the filling of uneven (concave) portions even when unevenness has been produced with different depths such as steps formed at the upper end portions of the contact holes 11, and step-like portions have been produced on the adhesion layers 12, and unevenness has been produced on the surface of the adhesion layer 12 formed by the over-etching of the tungsten layer 13. It also enables the achievement of a flat surface of the upper level wiring layer.

Further, the unevenness formed by the over-etch of the tungsten layer 13 can be prevented from being transferred to the surface morphology of the upper level wiring layer 15, thus providing a flat surface of the upper level wiring layer. This flat surface can reduce irregular reflection of exposing light beams at the surface of the upper level wiring layer 15 at the time of exposure of a photo-resist film to provide a desired pattern of an etching mask. Thus, a desired shape of an upper wiring 15 can be obtained.

Consequently, the wiring forming method according to the first embodiment can form an upper level wiring layer 15 having good coverage, a good quality layer, and a flat surface, and, further, can form an upper level wiring layer 15 having a desired shape.

When the adhesion layer is made of a sputtered W layer, there is provided another advantage. Empirically, it is found that a sputtered W layer can be controlled to have [1 0 0] orientation dominantly. Then, a blanket W layer formed by CVD to have a conformal shape on a [1 0 0] oriented W layer can also have a [1 0 0] orientation.

A surface of a W layer having a dominant orientation of [1 1 0] is easy to be roughen. The unevenness of a conventional blanket W layer may be ascribed to this nature of a [1 1 0] orientation.

A [1 0 0] oriented W layer can have a relatively flat surface. When the adhesion layer has the [1 0 0] orientation, the blanket W layer formed thereon can also have the [1 0 0] orientation. The surface of the adhesion layer can have a smoother surface compared to the conventional art, and the surface of the blanket W layer formed thereon can also have less asperity. This feature leads to an advantage that a [1 0 0] W layer is hard to roughen upon etch-back. When a [1 0 0] oriented W layer fills a connection or contact hole, a flat growth front can produce denser filling of a concave portion.

As a result, the surface of the blanket W layer having filled a connection hole can have less unevenness. When etch-back is performed to produce a small concave portion at the top of a connection hole, the possibility of giving damage to an underlying layer due to local etching can be reduced. When an upper level wiring layer is formed on the W plug, by reflow sputtering, a smoother surface of the wiring layer can be produced.

By selecting the conditions of sputtering appropriately, a W adhesion layer of low stress is expected to be produced. When a W blanket layer is formed by CVD thereon, it is expected that the stress of the blanket W layer can be reduced.

FIGS. 2A to 2J show steps of a wiring-forming method according to a second embodiment of the present invention. The wiring-forming method according to the second embodiment differs from the wiring-forming method according to the first embodiment as shown in FIGS. 1A to 1K in that, while the first embodiment connects a wiring of a level to a wiring of another level, this embodiment connects a substrate to a wiring.

Figure 2A:
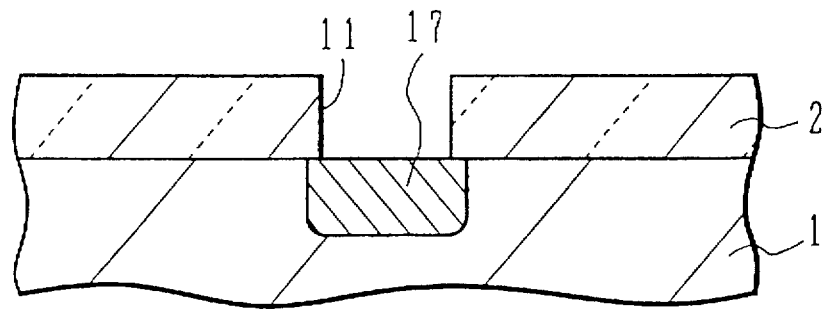
FIGS. 2A to 2J are longitudinal sectional views of a semiconductor device for illustrating steps of a wiring-forming method according to a second embodiment of the present invention.

In the second embodiment, as shown in FIG. 2A, a first level insulating layer 2 formed of an insulating material of $SiO_2$ or the like is formed on a semiconductor substrate 1 formed with an impurity diffusion region 17. Contact hole 11 is formed through the first level insulating layer 2 by etching using a photo-lithography method.

Figure 2B:
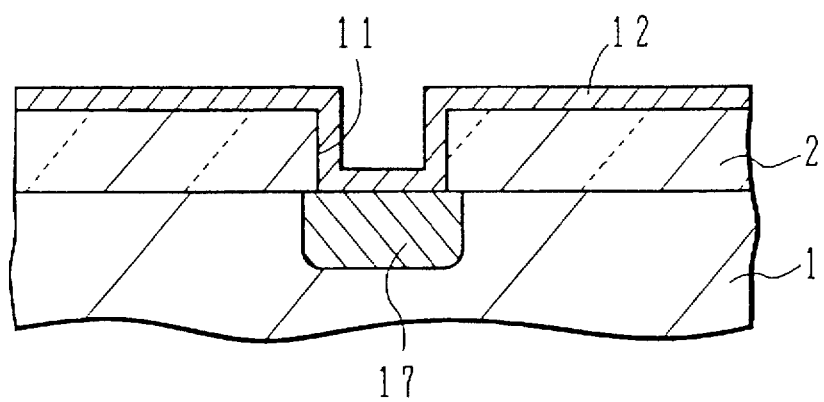

Next, as shown in FIG. 2B, an adhesion layer 12 is formed on a surface of the contact hole 11 and on the whole surface of the first level insulating layer 2 in the same manner as in the first embodiment.

Figure 2C:
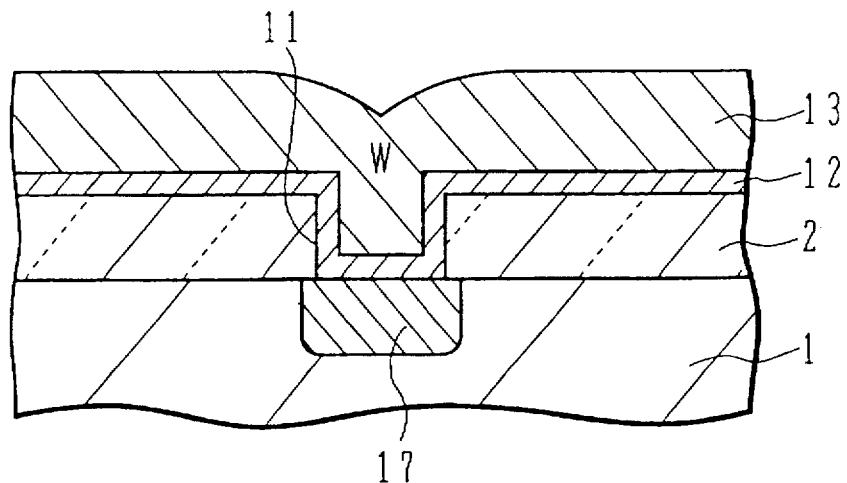
Figure 2D:
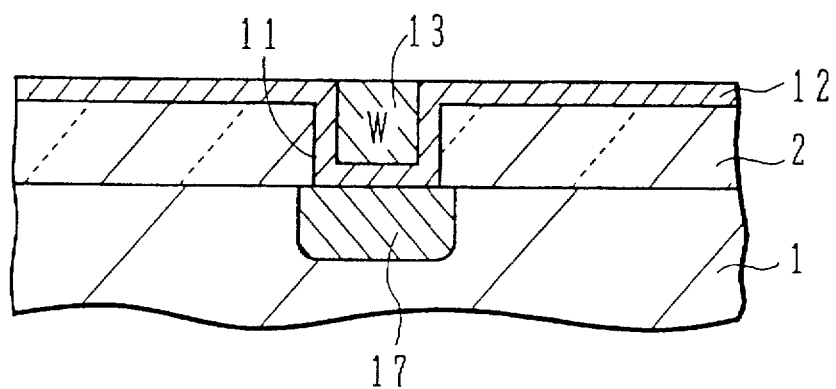

Then, as shown in FIG. 2C, a tungsten layer 13 is formed on the adhesion layer 12 in the same manner as in the first embodiment.

Figure 2E:
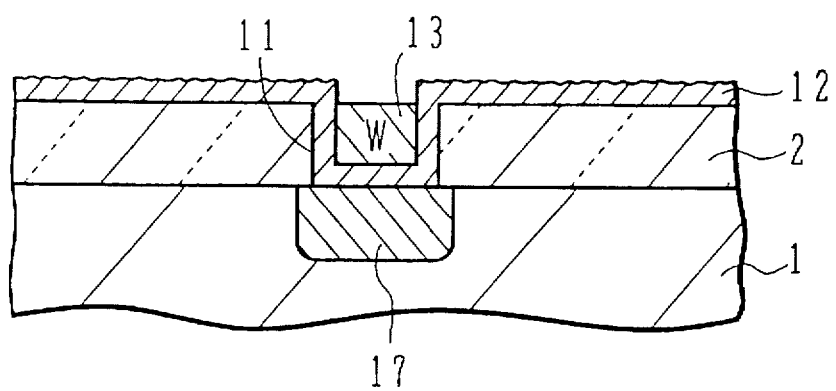
Figure 2F:
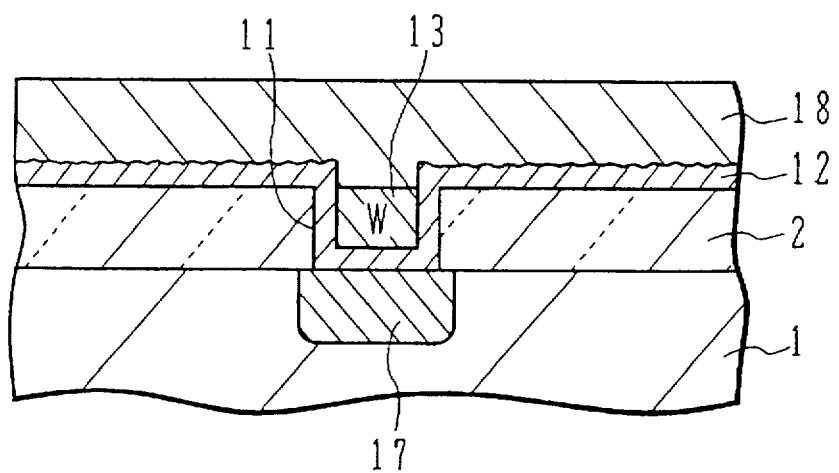

Then, the tungsten layer 13 is dry-etched using an etching gas similar to the gas used for the first embodiment to leave the tungsten layer 13 only in the inside of the contact hole 11. Further, as shown in FIG. 2E, the whole surface of the tungsten layer is over-etched until a small step or hollow is formed at the upper end portion of the contact hole 11. In other words, the upper surface of the tungsten layer 13 is positioned at a level slightly below the top end of the contact hole 11. Thereafter, as shown in FIG. 2F, an Al alloy layer is reflow-sputtered on the whole exposed surface of the adhesion layer 12 and the inside of the contact hole 11 filled with the tungsten layer 13, to form a wiring layer 18 formed of Al alloy layer at a temperature range of 400° to 500° C. The Al alloy may be similar to the conductive wiring material used in the first embodiment.

Figure 2G:
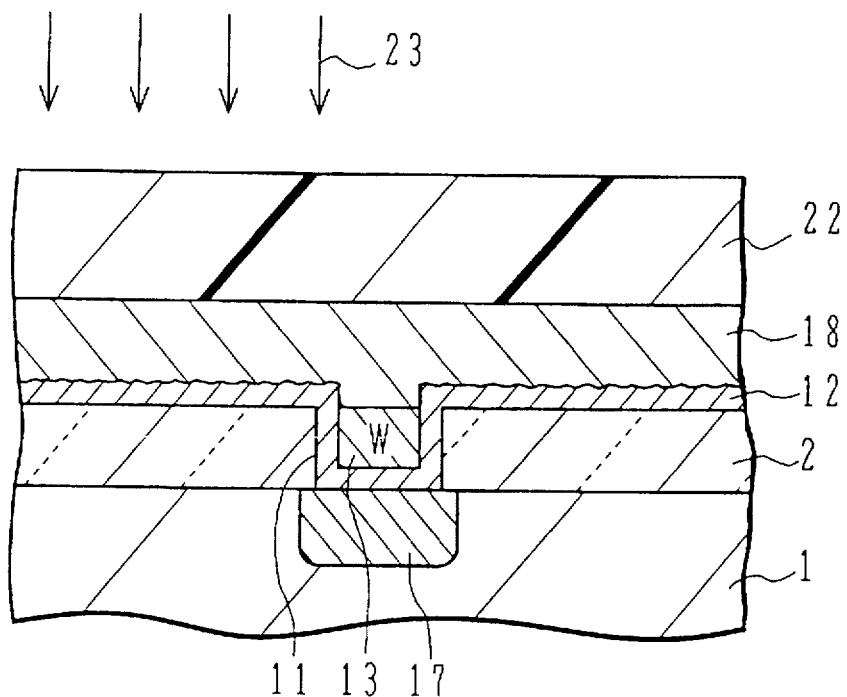

As shown in FIG. 2G, a photo-resist film 22 is spin-coated on the wiring layer 18. An ultraviolet ray is irradiated through a mask to expose the photo-resist selectively.

Figure 2H:
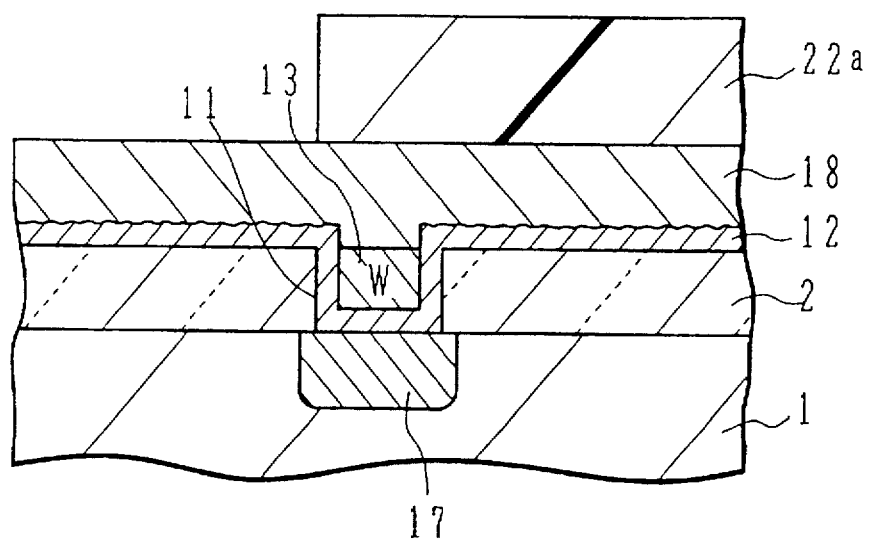
Figure 2I:
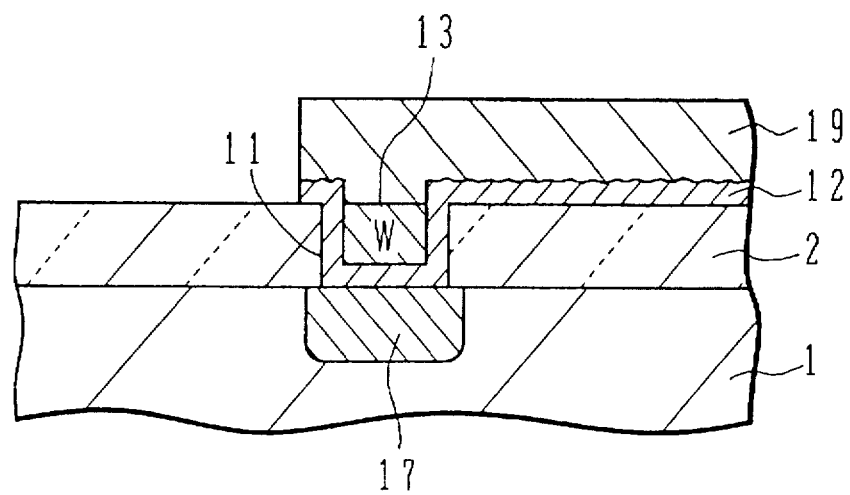
Figure 2J:
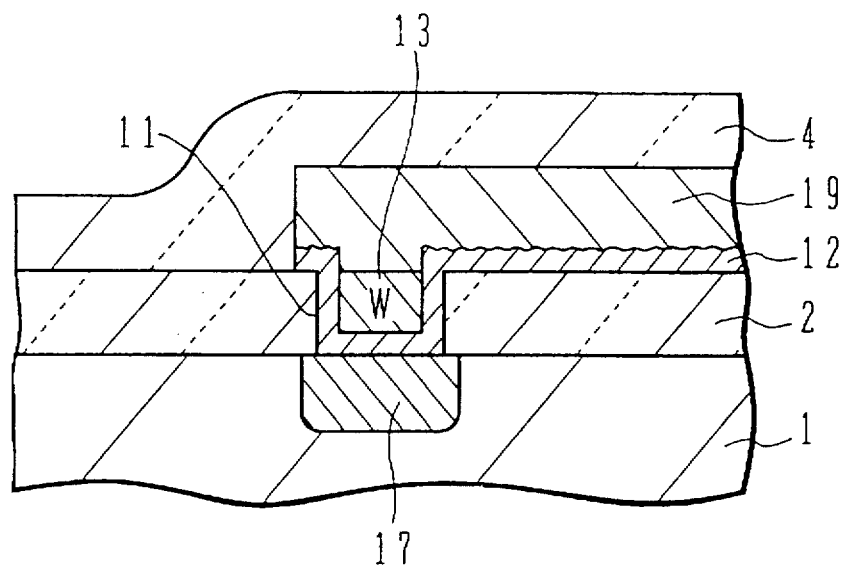
Figure 3A:
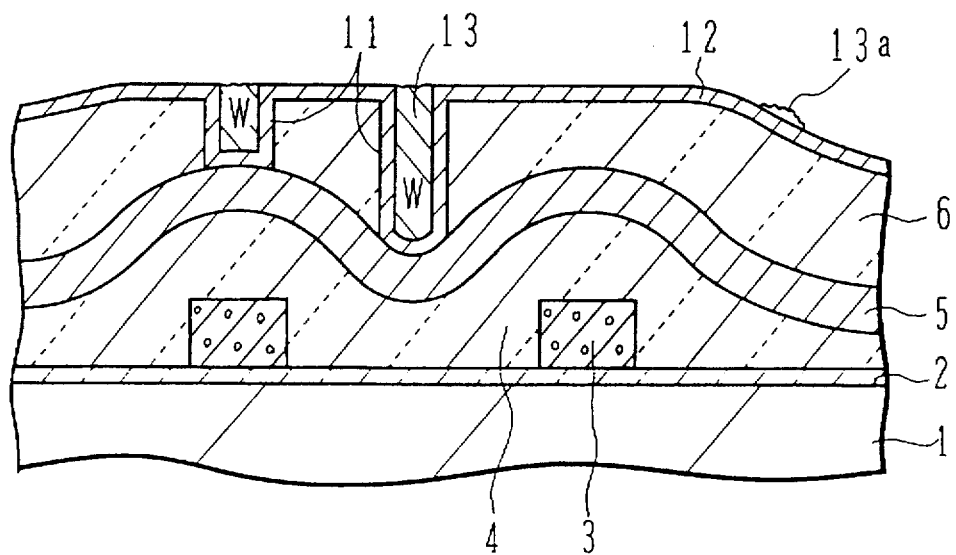
FIGS. 3A to 3C are sectional views of a semiconductor device for illustrating a prior art wiring-forming method employing a blanket tungsten CVD method.
Figure 3B:
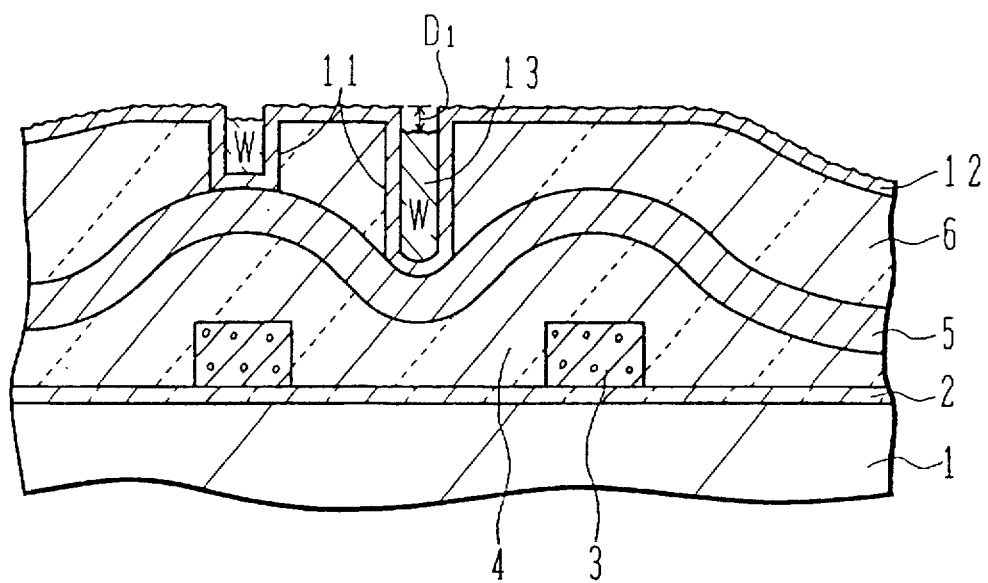
Figure 3C:
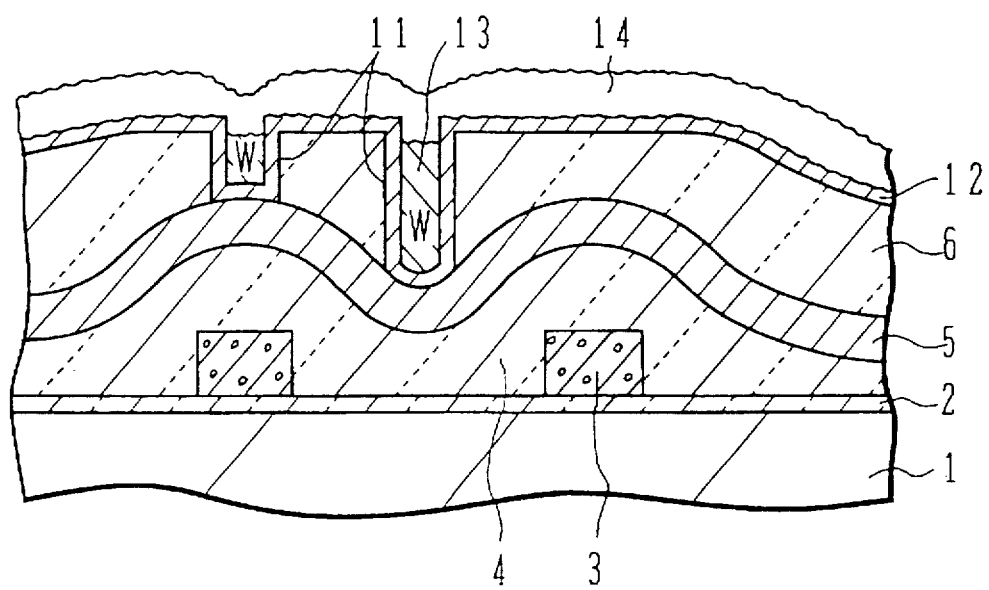
Figure 4:
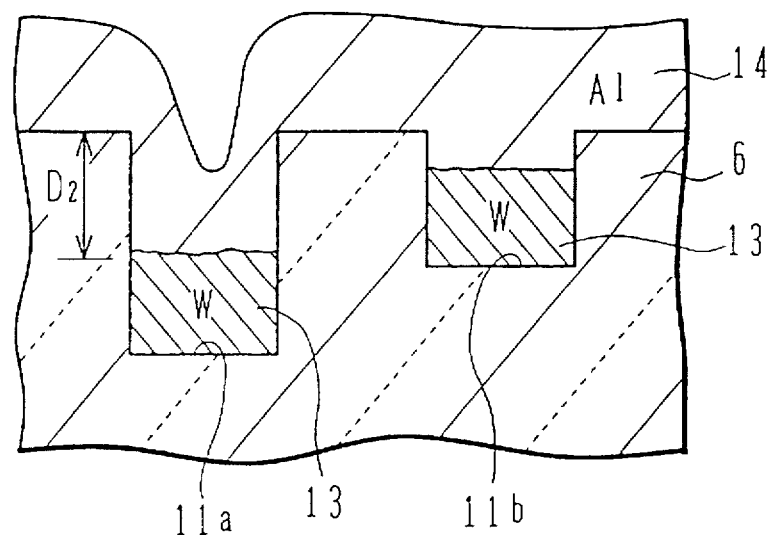
FIG. 4 is a sectional view of a semiconductor device for illustrating a prior art wiring-forming method employing a selective tungsten CVD method.
Figure 5:
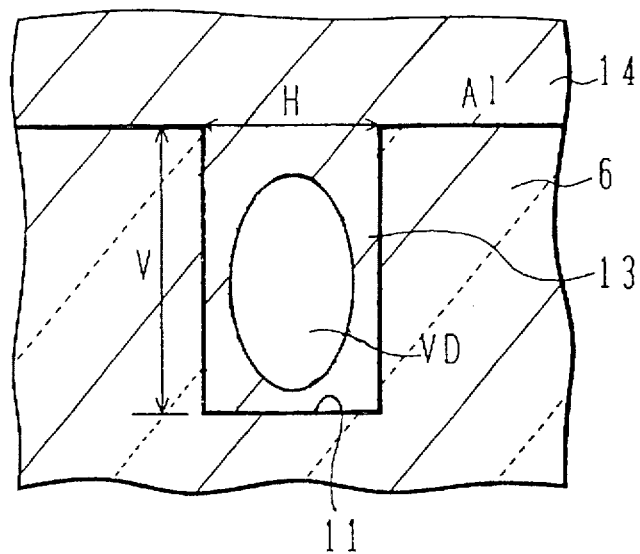
FIG. 5 is a sectional view of a semiconductor device for illustrating a prior art wiring-forming method employing a reflow-type sputtering method.

As shown in FIG. 2H, the resist film 22 is developed to form a resist pattern 22a. Using the resist pattern 22a as a mask, the wiring layer 18 is etched selectively. After the etching, the resist pattern 22a is removed by a method such as ashing or the like to leave a wiring 19 as shown in FIG. 2I. A second insulating layer 4 formed of an insulating material of $SiO_2$ or the like is formed on the wiring 19 and on the whole surface of the first insulating layer 2 as shown in FIG. 2J.

In the method according to the second embodiment, a first level insulating layer 2 is formed to cover a semiconductor substrate 1 and a contact hole 5 registered to a contact area on the semiconductor substrate 1 is formed through the first insulating layer 2. An adhesion layer 12 is formed on an impurity diffusion region 17 and a whole surface of the first level insulating layer 2. Further, after forming a tungsten layer 13 on the adhesion layer 12, the whole surface of the tungsten layer 13 is etched back until a small step or hollow is formed at the upper end of the contact hole 11, to leave the tungsten layer 13 only in the inside of the contact hole 11. The inside of the contact hole 11 is over-etched at this stage. Thereafter, a wiring layer of an Al alloy is reflow-sputtered on the whole surface of the adhesion layer 12 and the inside of the contact hole 11 at a comparatively low temperature to form a wiring layer 18. Thereby, the inside of the contact hole 11 is filled with the wiring layer 18 and a flat surface of the wiring layer 18 is obtained. The aspect ratio before reflow sputtering is also reduced, because the tungsten layer 13 is etched to a degree wherein a small step is provided at the upper end portion of the contact hole 11, and the contact hole 11 becomes shallow. The reflow-type sputtering can, therefore, be performed at a comparatively low temperature. Thus, deterioration of the quality of the wiring layer can be prevented.

The formation of the wiring layer 18 by reflow-type sputtering of conductive material at a comparatively low temperature enables the smoothing of uneven portions even when unevenness has been formed with different depths such as a step or hollow at the upper end portion of the contact hole 11, and a step-like portion has been formed on the adhesion layers 12, and unevenness has been formed on the surface of the adhesion layer 12 formed by the over-etching of the tungsten layer 13. It also enables the provision of a flat surface of the upper level wiring layer to be formed thereby. Further, the unevenness formed by the over-etch of the tungsten layer 13 can be prevented from being transferred to the wiring layer 18. Thus, a flat surface of the layer can be provided. This flat surface can reduce irregular reflection of exposing light on the surface of the wiring layer 18 at the time of exposure of photo-resist, thereby enhancing the precision of photo-lithography and providing a desired pattern of the etching mask. Thus, a desired pattern of wiring 19 can be obtained.

Therefore, the wiring-forming method according to the second embodiment can provide similar effects as those of the wiring-forming method according to the first embodiment.

The present invention has been described above in relation to preferred embodiments. The present invention is not limited to what have been described in connection with the embodiments. It will be apparent to those skilled in arts that various changes, substitutions, combinations and improvements can be made within the scope and spirit of the appended claims.

We claim:

1. A wiring-forming method comprising:
   forming an insulating layer covering an underlying layer including a contact portion exposed to an upper surface;
   forming a contact hole in said insulating layer at a position registered with said contact portion;
   sputtering at least one adhesion layer on the surface of said contact portion exposed in said contact hole and said insulating layer;
   depositing a blanket tungsten layer on said adhesion layer by CVD;
   etching the whole surface of said blanket tungsten layer until a small gap is formed at an upper end portion of the contact hole, to leave a tungsten film only in the inside of said contact hole; and
   forming a wiring layer on the whole surface of said insulating layer and the inside of the contact hole filled with said tungsten film by reflow-sputtering said wiring layer.

2. The wiring-forming method of claim 1, wherein said reflow-sputtering is performed in a temperature range of 350° to 500° C.

3. The wiring-forming method of claim 2, wherein said temperature range is 400° to 450° C.

4. The wiring-forming method of claim 2 including forming a heavily doped region forming said contact portion on a surface of a semiconductor substrate.

5. The wiring-forming method of claim 2 including comprising:
   forming an element structure on a surface of a semiconductor substrate;
   forming a lower level insulating layer covering said element structure on the surface of the semiconductor substrate; and
   forming a lower level wiring layer including said contact portion on said lower level insulating layer.

6. The wiring-forming method of claim 4, wherein said wiring layer is formed of Al alloy.

7. The wiring-forming method of claim 5, wherein said wiring layer is formed of Al alloy.

8. The wiring-forming method of claim 1, wherein the adhesion layer includes an uppermost (1 0 0) oriented tungsten layer.

9. The wiring-forming method of claim 8, wherein the blanket tungsten layer is formed by using hydrogen reduction of $WF_6$.

10. A method of manufacturing a semiconductor device, the method comprising the steps of:
   (a) providing a semiconductor substrate having first level conductive film patterns thereon;
   (b) forming a first insulating layer having undulations on a surface thereof;
   (c) forming second level conductive film patterns on the first insulating layer;
   (d) forming a second insulating layer over the second level conductive layer;
   (e) forming a first contact hole and a second contact hole through the second insulating layer to expose surfaces of said second level conductive film patterns;
   (f) sputtering an adhesion layer over the first and second contact holes and the second insulating layer;
   (g) depositing a blanket tungsten layer over the adhesion layer;
   (h) removing the blanket tungsten layer on a flat surface, while leaving the blanket tungsten layer remaining in the first and second contact holes, the remaining blanket tungsten layer partially filling the first and second contact holes with depressions on the tops of the filling blanket tungsten layer;
   (i) forming a third level conductive layer over the adhesion layer and the remaining blanket tungsten layer while applying heat to fluidize the third level conductive layer, the third level conductive layer thereby filling the depressions; and
   (j) patterning the third level conductive layer.

11. The method of claim 10, wherein the first level conductive film patterns include polycrystalline silicon.

12. The method of claim 10, wherein the second level conductive film patterns and the third level conductive film patterns include aluminum alloy.

13. The method of claim 10, wherein the adhesion layer includes tungsten.

14. The method of claim 10, wherein at the step (e), depths of the first and second contact holes are different.

15. The method of claim 10, wherein the step (i) is performed at a temperature in a range of 350°–500° C.

16. The method of claim 15, wherein the temperature is in a range of 400°–450° C.

17. The method of claim 10, wherein the adhesion layer includes an uppermost (100) oriented tungsten layer.

18. The method of claim 17, wherein the blanket tungsten layer is formed by chemical vapor deposition using hydrogen reduction of $WF_6$.

19. A method of manufacturing a semiconductor device, the method comprising the steps of:

(a) providing a semiconductor substrate having an insulating film thereon;

(b) forming a contact hole through the insulating film;

(c) sputtering an adhesion layer over the insulating layer and the contact hole;

(d) depositing a blanket tungsten layer having a surface asperity, the blanket tungsten layer fully filling the contact hole;

(e) removing the blanket tungsten layer until a gap is generated in the contact hole, leaving a remaining blanket tungsten layer in the contact hole; and (f) depositing a conductive layer over the tungsten remaining blanket tungsten layer and the adhesion layer by reflow-sputtering said conductive layer.

* * * * *